United States Patent
Shin et al.

(10) Patent No.: US 8,822,339 B2
(45) Date of Patent: Sep. 2, 2014

(54) SLURRY COMPOSITION FOR CMP, AND POLISHING METHOD

(75) Inventors: Dong-Mok Shin, Daejeon (KR); Eun-Mi Choi, Daejeon (KR); Seung-Beom Cho, Daejeon (KR)

(73) Assignee: LG Chem, Ltd., Seoul (KR)

(*) Notice: Subject to any disclaimer, the term of this patent is extended or adjusted under 35 U.S.C. 154(b) by 11 days.

(21) Appl. No.: 13/502,062

(22) PCT Filed: Oct. 13, 2010

(86) PCT No.: PCT/KR2010/007006
§ 371 (c)(1),
(2), (4) Date: Jul. 2, 2012

(87) PCT Pub. No.: WO2011/049318
PCT Pub. Date: Apr. 28, 2011

(65) Prior Publication Data
US 2012/0270399 A1    Oct. 25, 2012

(30) Foreign Application Priority Data
Oct. 13, 2009 (KR) .................. 10-2009-0097048

(51) Int. Cl.
*H01L 21/461* (2006.01)

(52) U.S. Cl.
USPC ........ 438/692; 252/79.1; 252/79.2; 252/79.3; 252/79.4; 216/88; 438/689; 438/690; 438/691

(58) Field of Classification Search
USPC ............ 252/79.1–79.4; 216/88; 438/689–692
See application file for complete search history.

(56) References Cited

U.S. PATENT DOCUMENTS

| | | | | |
|---|---|---|---|---|
| 6,821,897 B2 * | 11/2004 | Schroeder et al. | ............ | 438/692 |
| 7,799,687 B2 | 9/2010 | Seong et al. | | |
| 7,838,482 B2 * | 11/2010 | Fukasawa et al. | ............ | 510/175 |
| 8,043,970 B2 | 10/2011 | Lee et al. | | |
| 8,524,111 B2 | 9/2013 | Fukusawa et al. | | |
| 2002/0011031 A1 * | 1/2002 | Hattori et al. | ................... | 51/308 |
| 2006/0014390 A1 | 1/2006 | Lee et al. | | |
| 2006/0162260 A1 | 7/2006 | Nho et al. | | |
| 2007/0077865 A1 | 4/2007 | Dysard et al. | | |
| 2007/0148978 A1 * | 6/2007 | Han et al. | ...................... | 438/692 |
| 2007/0176140 A1 | 8/2007 | Matsuda et al. | | |
| 2007/0275226 A1 | 11/2007 | Kulp | | |
| 2010/0009611 A1 | 1/2010 | Fukuda et al. | | |

FOREIGN PATENT DOCUMENTS

| | | |
|---|---|---|
| CN | 1715311 A | 1/2006 |
| CN | 1860592 A | 11/2006 |
| CN | 101006153 A | 7/2007 |
| CN | 101077961 A | 11/2007 |
| CN | 101130665 A | 2/2008 |
| CN | 101139446 A | 3/2008 |
| JP | 2004-335897 A | 11/2004 |
| JP | 2008-221353 A | 9/2008 |
| JP | 2009510797 A | 3/2009 |
| JP | 2009532859 A | 9/2009 |
| KR | 10-0829594 B1 | 5/2008 |
| KR | 10-2009-0003985 A | 1/2009 |
| WO | 2007088868 A1 | 8/2007 |
| WO | 2007114814 A1 | 10/2007 |
| WO | 2008/029537 A1 | 3/2008 |
| WO | 2009/107986 A1 | 9/2009 |

OTHER PUBLICATIONS

Supplementary European Search Report issued in European Appln. No. 10 82 5143.0 on Jul. 10, 2014, 3 pages.

* cited by examiner

*Primary Examiner* — Nadine Norton
*Assistant Examiner* — Maki Angadi
(74) *Attorney, Agent, or Firm* — Rothwell, Figg, Ernst & Manbeck, P.C.

(57) ABSTRACT

The present invention relates to a CMP slurry composition comprising an abrasive particle; a dispersant; an ionic polymer additive; and a non-ionic polymer additive including a polyolefin-polyethylene glycol copolymer including at least two polyethylene glycol repeat unit as a backbone and at least a polyethylene glycol repeating unit as a side chain, and a polishing method with using the slurry composition. The CMP slurry composition shows a low polishing rate to a single-crystalline silicon layer or a polysilicon layer and a high polishing rate to a silicon oxide layer, resulting in having an excellent polishing selectivity.

22 Claims, No Drawings

US 8,822,339 B2

SLURRY COMPOSITION FOR CMP, AND POLISHING METHOD

CROSS REFERENCE TO RELATED APPLICATIONS

This application is a 35 U.S.C. §371 National Phase Entry Application from PCT/KR2010/007006, filed Oct. 13, 2010, and designating the United States, which claims priority under 35 U.S.C. §119 to Korean Patent Application No. 10-2009-0097048 filed on Oct. 13, 2009, which is incorporated herein in its entirety.

TECHNICAL FIELD

The present invention provides a slurry composition for chemical mechanic polishing (CMP) and a polishing method using the same. More specifically, the present invention relates to the slurry composition for CMP showing excellent polishing selectivity where the polishing rate to single-crystalline silicon layer or polysilicon layer is low and the polishing rate to silicon oxide layer is high, and the polishing method using the slurry composition.

BACKGROUND ART

Recently, Shallow Trench Isolation (STI) process has been used to separate electrically the semiconductor devices such as DRAM or flash memory. The STI process includes the steps of forming a trench on the silicon wafer where a polishing stop layer is formed by etching or photolithography, filing the trench with an insulating material such as silicon oxide, and planarization to remove the step height caused by excessive amount of insulating material.

The reflow, SOG or Etchback processes for the planarization has been used in the conventional art, but could not fulfill the satisfactory result as the semiconductor device has a trend of the high density integration and high performance. Thus, the Chemical Mechanical Polishing (CMP) process has been used widely for planarization.

The CMP process is to polish the wafer mechanically with the abrasive particle and to polish chemically with the chemicals in the slurry composition, by contacting the wafer with polishing pad and moving relatively, while supplying the slurry composition including the many chemical components.

With accordance with the CMP process, an insulating materials such as silicon oxide is selectively removed to form the trench filled with the removed insulating film. When the upper surface of polishing stop layer is exposed in the polishing and planarization process, the polishing should be stop to polish the wafer uniformly and to maintain the performance of element and reliability of process by minimizing the step height between the active region and the field region caused by excessive polishing.

The silicon nitride film was used as a polishing stop layer in the conventional art. However, as the line width of the semiconductor device becomes narrow and Integrated Chip (IC) has higher density integration recently, the single-crystalline silicon or polysilcone thin film has been reviewed as a polishing stop layer. Accordingly, there is a need for the CMP slurry composition having an excellent polishing selectivity that means a low polishing rate to the polishing stop layer such as single-crystalline silicon layer or polysilicon layer and a high polishing rate to silicon oxide layer.

DISCLOSURE

Technical Problem

An object of the present invention is to provide a CMP slurry composition having an excellent polishing selectivity that the polishing rate to polishing stop layer such as single-crystalline silicon layer or polysilicon layer is low and the polishing rate to silicon oxide layer is high.

single-crystalline silicon layerpolysilicon layersilicon oxide layerAnd, the other object of the present invention is to provide a method of polishing with the CMP slurry composition.

Technical Solution

The present invention provides a CMP slurry composition comprising an abrasive particle; dispersant; an ionic polymer additive; and a nonionic polymer additive including a polyolefin-polyethylene glycol copolymer including at least two polyethylene glycol repeat units where at least one of the repeating units is a side chain.

In addition, the present invention provides a method of polishing a substrate comprising a step of polishing the target layer on semiconductor substrate with the CMP slurry composition.

The CMP slurry composition and the polishing method according to an embodiment of the present invention will be described in more detailed.

In accordance with an embodiment of the present invention, a chemical mechanical polishing (CMP) slurry composition comprising an abrasive particle; dispersant; an ionic polymer additive; and a nonionic polymer additive including a polyolefin-polyethylene glycol copolymer including at least two polyethylene glycol repeat units where at least one of the repeating units is a side chain, is provided.

As the CMP slurry composition contains an abrasive particle, a dispersant, an ionic polymer additive and a non-ionic polymer additive having a specific structure, it shows a low polishing rate to a single-crystalline silicon layer or a polysilicon layer and a high polishing rate to a silicon oxide layer. Therefore, the CMP slurry composition can show an excellent polishing selectivity (for example, a ratio of the polishing rate of polysilicon layer:the polishing rate of the silicon oxide layer is 1:35 or more). And, When the CMP slurry composition is applied to the target layer such as a silicon oxide layer and the like, the target layer can be removed with high polishing rate and selectivity.

As a experimental result of the present inventors, the present inventors found that since the CMP slurry composition includes the non-ionic polymer additive having the specific structure and the ionic polymer additive, it has a high dispersion stability and a high polishing selectivity in the polishing and the planarization processes, thereby being capable of polishing a silicon oxide layer with high polishing rate.

In addition, because the CMP slurry composition can be dispersed uniformly in polishing region, the surface properties of the single-crystalline silicon layer or the polysilicon layer can be uniformly controlled, so as to minimize the dishing or erosion. The dishing and erosion refers to a phenomenon that the concave part of polished surface is formed by removing a part of the necessary region, and cause the deteriation of the electric property of the semiconductor device.

Meanwhile, the ionic polymer additive is at least one selected from the group consisting of a comb-type copolymer including a backbone derived from an ionic polymer and a side chains derived from non-ionic polymer; polyacrylic acid; polymethacrylic acid; and a mixture thereof. The ionic polymer additive shows decreased polishing rate to the polishing stop layer by adhering to the surface of a polishing stop layer, and thus can achieve a high polishing selectivity of the silicon oxide layer to the polishing stop layer such as single-crystalline silicon layer or polysilicon layer.

In particular, in case that the comb-type copolymer is used as the ionic polymer additive, the side chains derived from the non-ionic polymer can protect the single-crystalline silicon layer or polysilicon layer by adhering to surface of single-crystalline silicon layer or polysilicon layer, thereby being capable of decreasing the polishing speed of single-crystalline silicon layer or polysilicon layer. On the other hand, the backbone derived from the ionic polymer such as polyacrylic acid cannot decrease the polishing speed of silicon oxide layer, and thus can achieve a high polishing selectivity of silicon oxide layer to single-crystalline silicon layer or polysilicon layer.

Additionally, the comb-type copolymer has shorter backbone than the linear copolymer having the same molecular weight backbone and thus can minimize the aggregation phenomenon in the slurry composition. Therefore, the comb-type copolymer prevents the micro-scratch which occurs due to the macromolecules produced from the slurry accumulated in polishing pad. The comb-type copolymer has higher density of polymer per unit area than the linear copolymer due to the inclusion of the side chains. Thus, the comb-type copolymer can lower the polishing rate of single-crystalline silicon layer or polysilicon layer effectively by adhering thickly to the surface of polysilicon layer, so as to improve the polishing selectivity. Since the comb-type copolymer is included as the ionic polymer additive, the CMP slurry composition achieves a high polishing selectivity of silicon oxide layer to single-crystalline silicon layer or polysilicon layer.

The comb-type copolymer can be a comb-type copolymer including acrylate or methacrylate repeating unit or as a backbone to which alkylene oxide repeating unit as side chains attaches to form the comb-type of the backbone and the side chain. As long as the comb-type copolymer of the backbone and the side chain includes acrylate or methacrylate repeating unit or as a backbone to which alkylene oxide repeating unit as side chains attaches, it cannot be used without any particular limitation. Preferably, the alkylene oxide repeating unit can be polyethylene oxide or polypropylene oxide repeating unit.

Also, the comb-type copolymer can be a copolymer including at least one repeating unit selected from the group consisting of polyacrylic acid and polymethacrylic acid and at least one repeating unit selected from the group consisting of polypropylene oxide methacrylic acid, polypropylene oxide acrylic acid, polyethylene oxide methacrylic acid and polyethylene oxide acrylic acid.

The comb-type copolymer can comprise a copolymer that is prepared by copolymerized of a monomer of Chemical formula 1 and a monomer of Chemical formula 2 and that the backbone chain and side chain form comb-type shape

[Chemical formula 1]

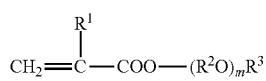

In Chemical formula 1,
$R^1$ is a hydrogen or methyl,
$R^2$ is C2-3 alkyl,
$R^3$ is a hydrogen or C1-4 alkyl,
m is an integer of 2 to 100,

[Chemical formula 2]

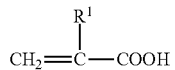

In Chemical formula 2,
$R^1$ is a hydrogen or methyl.

The comb-type copolymer can include a monomer represented Chemical formula 1 in an amount of 10 to 50 wt %. When the monomer is not contained in an amount of less than 10 wt %, the amount of comb-type copolymer adhering to the surface of the single-crystalline silicon layer or polysilicon layer is excessively small, the composition shows the low polishing selectivity of the silicon oxide layer to the single-crystalline silicon layer or polysilicon layer. When the amount exceeds 50 wt %, the water solubility of the comb-type copolymer decreases to cause the aggregation of abrasive particles, thereby lowering the polishing rate and polishing selectivity to the subject surface to be polished.

The structure and the preparing method of comb-type copolymer are explained for examples, in KR 10-0786948, KR 10-0786949, KR 10-0786950 and etc. and can be obtained from the disclosures in the documents by an ordinarily-skilled person in the art.

Meanwhile, the CMP slurry composition can contain the ionic polymer additive in an amount of 0.05 to 5 wt %. Such amount of the ionic polymer additive can control the polishing speed of single-crystalline silicon layer or polysilicon layer. When the ionic polymer additive is contained in less than 0.05 wt %, the polishing rate to polishing stop layer such as single-crystalline silicon layer or polysilicon layer can be increased. Thus the polishing selectivity of the silicon oxide layer to the single-crystalline silicon layer or polysilicon layer can be decreased. On the other hand, when the amount of the ionic polymer additive is more than 5 wt %, the polishing selectivity can be decreased due to low polishing rate to silicon oxide layer, and the dispersing stability of the slurry composition can be decreased due to aggregating the abrasive particle.

The ionic polymer additive can have a weight-average molecular weight of 1,000 to 500,000. When the weight-average molecular weight of the ionic polymer additive is lower than 1,000, the polishing selectivity can be decreased because the polishing rate to single-crystalline silicon layer or polysilicon layer is increased. When it exceeds 500,000, the abrasive particles can aggregate because the water-solubility of the ionic polymer additive can be decreased in the preparation process for CMP slurry composition, and thus the polishing rate and polishing selectivity to the target layer can be decreased. Meanwhile, the non-ionic polymer additive having a specific structure may be a polyolefin-polyethylene glycol copolymer including at least two polyethylene glycol repeating units where at least one of polyethylene glycol repeating units forms a side chain. The polyolefin-polyethylene glycol copolymer can be represented by Chemical formula 3 or Chemical formula 4.

[Chemical formula 3]

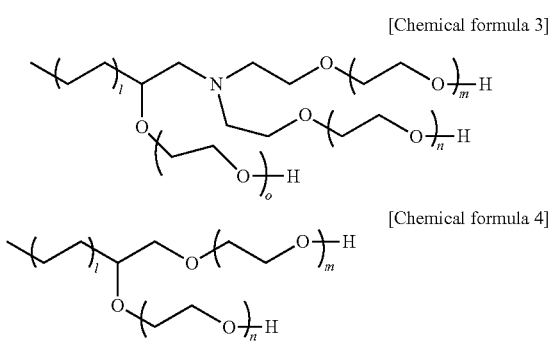

[Chemical formula 4]

In Chemical formula 3 and 4, l is an integer of 4 to 100, m is an integer of 4 to 250, n is an integer of 4 to 250, and o is an integer of 4 to 250.

The polyolefin-polyethylene glycol copolymer represented by Chemical formula 3 or 4 as a non-ionic polymer additive can function as a wetting agent in the polishing process, to help the CMP slurry composition to dissolve uniformly in the wide region of wafer. Thus, CMP slurry composition containing the polyolefin-polyethylene glycol copolymer represented by Chemical formula 3 or 4 as a non-ionic polymer additive shows a high polishing rate to the substrate film to be polished and the improved polishing uniformity, resulting in minimizing dishing phenomenon of the excessive polishing to the target layer such as silicon oxide layer.

The polyolefin-polyethylene glycol copolymer includes a hydrophobic part and a hydrophilic part where the hydrophobic part is a polyolefin repeating unit and the hydrophilic part is a polyethyeneglycol repeating unit. More preferably, the polyolefin repeating unit is not limited particularly, and can be selected from the polyethylene or polyethylene-propylene having a molecular weight of 100 to 2,000. In the case that the polyolefin repeating unit as a hydrophobic part includes a polyethylene or polyethylene-propylene copolymer having a molecular weight of 100 to 2,000, polyethylene glycolthe dispensability and penetrating capacity in the wafer of the polyolefin-polyethylene glycol copolymer of the aqueous CMP slurry composition can be increased. In case that the molecular weight of the polyolefin repeating unit is less than 100, the addition of the non-ionic polymer additive does not have a sufficient effect. In case that The molecular weight of polyolefin repeating unit exceeds 2,000, a water-solubility of the slurry composition can be decreased and the slurry composition cannot function as a polishing agent preferably.

The CMP slurry composition contains the non-ionic polymer additive as an amount of 0.0001 to 0.5 wt %. The amount of the non-ionic polymer additive can control the polishing rate and the polishing selectivity. If the non-ionic polymer additive is contained in an amount of less than 0.0001 wt %, the preferable polishing selectivity to the target layer to be polished cannot be achieved. If the amount is higher than 0.5 wt %, the polishing rate to the insulating layer drops sharply and the CMP slurry composition cannot functions properly as a polishing agent.

To increase the solubility of non-ionic polymer additive, the CMP slurry composition can further contain dodecyl benzensulphate (DBSA), dodecyl sulphate or a salt thereof.

The CMP slurry composition includes an abrasive particle to polish the target layer mechanically. The abrasive particle can be an abrasive particle which has been used conventionally, and for examples, metal oxide particle, organic particle or organic-inorganic particle.

For examples, the metal oxide particles can be silica particle, ceria particle, zirconia particle, titania particle or etc., or a mixture including at least two materials. In addition, the metal oxide particles can be any particles which are prepared by any methods such as a smoking method or a sol-gel method, and it is not limited thereto.

And, the examples of the organic particles are the styrene polymer particle such as polystyrene or styrene copolymer; acrylic polymer particles such as polymethacrylate, acrylate copolymer or methacrylate copolymer; polyvinyl particle; polyamide particle; polycarbonate particle; polyimide particle, or the like, and it is not limited thereto. A single polymer particle or core-shell spherical particle, which is selected from the above examples, can be used without limitation. In addition, the polymer particle prepared by any polymerization method such as emulsifying polymerization or suspension polymerization can be used as the organic particle.

The abrasive particle can be an inorganic-organic complex particle which can be prepared by mixing the organic material such as the polymer and the inorganic material such as the metal oxide.

Preferably, the particles can be cerium oxide ($CeO_2$) in considering the polishing rate, polishing speed to the target layer to be polished or suitable surface protection.

The abrasive particle can have an average diameter of 10 to 500 nm, in considering the suitable polishing speed of target layer to be polished, and the dispersing stability in the slurry composition. If the diameter of the abrasive particle is small excessively, the polishing speed of the abrasive particle to target layer is deteriorated. On the other hand, if the size of particle is excessively large, the dispersing stability of abrasive particle can be decreased.

The abrasive particle can be contained in an amount of 0.001 to 5 wt %, or preferably 0.05 to 2 wt % of the CMP slurry composition. If the amount of abrasive particle is small excessively, the polishing rate to the target layer can be decreased. But, if the amount of abrasive particle is excessively large, the dispersing stability of abrasive particle can be deteriorated in the slurry composition.

Meanwhile, the CMP slurry composition can further include a dispersant for the abrasive particle to improve the polishing efficiency of the abrasive particle. The dispersant can be a non-ionic polymer dispersant or anionic polymer dispersant. The non-ionic polymer dispersant can be polyvinylalcohol (PVA), ethyleneglycol (EG), glycerin, polyethyeneglycol (PEG), polypropyleneglycol (PPG) or polyvinylpyrrolidon (PVP), and the anionic polymer dispersant can be polyacrylic acid, polymethacrylic acid, ammonium polyacrylate, ammonium polymethacrylate or polyacrylic maleic acid, but the non-ionic polymer dispersant and the anionic polymer dispersant cannot be limited thereto.

The CMP slurry composition can contain the dispersant of 0.1 to 100 parts by weight based on 100 parts by weight of the abrasive particle. If the amount of dispersant is less than 0.1 parts by weight, the decreased dispersing capacity cause the rapid preparation of the abrasive particle in transfer of the slurry composition, thereby causing a difficulty in supplying the abrasive particles uniformly. Otherwise, if the amount exceeds 100 pads by weight, the dispersant polymer layer which functions as a cushion around the abrasive particles can be formed thickly. Thus, the surface of the abrasive particles hardly contacts with the polishing surface, and the polishing speed can be lowered.

pH of the CMP slurry composition can be preferably adjusted to pH 4 to 8, for example by the addition of pH adjuster, after mixing the abrasive particles and dispersant in water.

The pH adjuster can be a basic pH adjuster such as potassium hydroxide, sodium hydroxide, ammonia water, Rubidium hydroxide, Cesium hydroxide, Sodium hydrogen carbonate, or sodium carbonate, or an acidic pH adjuster such as hydrochloric acid, nitric acid, sulfuric acid, phosphoric acid, formic acid or acetic acid. In case that the strong acid or strong base is used as pH adjuster, the pH adjuster can be used after being diluted with a deionized water to prevent the aggregation of the slurry caused by the local pH change.

In addition, the CMP slurry composition can further contain water or an aqueous solvent including water as a medium to dissolve or disperse the components as a residual amount of the composition. Thus, the CMP slurry composition can contain 0.001 to 5 wt % of the abrasive particle; 0.05 to 5 wt % of the ionic polymer additive; 0.0001 to 0.5 wt % of non-ionic polymer additive; 0.1 to 100 parts by weight dispersant based on 100 parts by weight of the abrasive agent; and a residual amount of pH adjuster and water.

According to the other embodiment of the present invention, it is provided to a polishing method comprising the step of polishing the target layer to be polished on the semiconductor substrate with the CMP slurry composition. When the target layer is polished with the CMP slurry composition, the polishing selectivity of silicon oxide layer to single-crystalline silicon layer or polysilicon layer become high, and the semiconductor substrate can be polished uniformly. The target layer to be polished can be a silicon oxide layer.

More specifically, the polishing method can be a method of polishing or planarization of the silicon oxide layer using the single-crystalline silicon layer or polysilicon layer as a polishing stop layer. For example, the polishing method can includes the steps of forming a pattern of single-crystalline silicon layer or polysilicon layer on the semiconductor substrate; forming a silicon oxide layer on the pattern of single-crystalline silicon layer or polysilicon layer formed on the semiconductor substrate; and polishing the silicon oxide layer to expose the single-crystalline silicon layer or the polysilicon layer.

Meanwhile, the polishing method can be applied for the shallow-trench isolation (STI) process of semiconductor devices (where the silicon oxide layer used as a target layer to be polished forms a separating layer embedded in trench to define the field region of the semiconductor device), and for a process of forming an inter layer dielectric (ILD) of the semiconductor device

Advantageous Effect

The present invention provides a CMP slurry composition showing excellent polishing selectivity where the polishing rate to single-crystalline silicon layer or polysilicon layer is low and the polishing rate to silicon oxide layer is high, and a polishing method using the CMP slurry composition.

EXAMPLES

The present invention is further explained in more detail with reference to the following examples. These examples, however, should not be interpreted as limiting the scope of the present invention in any manner.

Examples 1 to 9

Preparation of CMP Slurry Composition

Ceria as an abrasive agent (LG Chem Ltd), polyacrylic acid or polymethacrylic acid (LG Chem Ltd) as a dispersant, polyacrylic acid (3 k and 7 k: LG Chem Ltd, 250 k: BASF) or an ionic polymer additive and a non-ionic polymer additive (Mitsui chemicals) for testing the selectivity of polypropylene oxide methacrylic acid-polyacrylic acid copolymer (LG Chem Ltd) were mixed in a water at an amount of Table 1. Then, the pH of composition was adjusted to pH 6 with ammonia.

TABLE 1

The compositions of Examples 1 to 9

|  | Abrasive agent (wt %) | Dispersant (based on 100 parts by weight of abrasive agent) | Ionic polymer additive (wt %) | non-ionic polymer additive (added amount, content) | pH |
|---|---|---|---|---|---|
| Example 1 | ceria(0.7) | PMAA 11K (2) | PPOMA 5K(0.1) | M-02(50 ppm, 0.005 wt %) | 6 |
| Example 2 | ceria(0.7) | PMAA 11K (2) | PPOMA 5K(0.1) | M-03(50 ppm, 0.005 wt %) | 6 |
| Example 3 | ceria(0.7) | PMAA 11K (2) | PPOMA 5K(0.1) | M-05(50 ppm, 0.005 wt %) | 6 |
| Example 4 | ceria(0.7) | PMAA 11K (2) | PPOMA 5K(0.1) | M-08(50 ppm, 0.005 wt %) | 6 |
| Example 5 | ceria(0.7) | PMAA 11K (2) | PPOMA 5K(0.1) | M-03(500 ppm, 0.05 wt %) | 6 |
| Example 6 | ceria(0.7) | PMAA 11K (2) | PPOMA 5K(0.1) | M-03(1300 ppm, 0.13 wt %) | 6 |
| Example 7 | ceria(0.7) | PMAA 11K (2) | PAA 7K(0.35) | M-03(50 ppm, 0.005 wt %) | 6 |
| Example 8 | ceria(0.7) | PMAA 11K (2) | PPOMA 5K(0.1) | M-03(50 ppm, 0.005 wt %) | 6 |
| Example 9 | ceria(0.7) | PAA 7K (2) | PPOMA 5K(0.1) | M-03(500 ppm, 0.05 wt %) | 6 |

1. In Table 1, PMAA is poly methacrylic acid, PAA is polyacrylic acid, PPOMA is polypropylene oxide methacrylic acid—polyacrylic copolymer, and 3K, 5K, 7K, and 250K refer to an weight-average molecular weight of 3,000, 5,000, 7,000, and 250,000 respectively.

2. M-02, M-03, M-05, and M-08 are shown in Table 2.

TABLE 2

The non-ionic polymer additive

| Samples | PE Mn (type) | PEG Mn |
|---|---|---|
| M-02 | 850 | 280 * 3 |
| M-03 | 850 | 430 * 3 |
| M-05 | 850 | 430 * 2 |
| M-08 | 850 | 570 * 3 |

In Table 2, PE is polyethylene, PEG is polyethylene glycol, and Mn means number average molecular weight.

M-02, M-03 and M-08 are a copolymer including a polyethylene backbone attached by three polyethyeneglycol side chains and having a chemical structure represented by Chemical formula 3. M-05 is a copolymer including a polyethyene backbone attached by two polyethyeneglycol side chains and having a chemical structure represented by Chemical formula 4.

Comparative Examples 1-6

Preparation of CMP Slurry Composition

Ceria (LG Chem Ltd) as an abrasive agent, polymethacrylic acid (LG Chem Ltd) as a dispersant, polyacrylic acid or polypropylene oxide methacrylic acid—poly acrylic acid copolymer as an ionic polymer additive, and non-ionic polymer additive were mixed in a water at an amount of Table 3 to be 100 wt % of composition. Then, the pH of composition was adjusted to pH 6 with ammonia.

TABLE 3

The composition of Comparative Examples 1 to 6

| | Abrasive agent (wt %) | Dispersant (based on 100 parts by weight of abrasive agent) | Ionic polymer additive(wt %) | non-ionic polymer additive(added amount, content) | pH |
|---|---|---|---|---|---|
| Comparative Example 1 | ceria(0.7) | PMAA 11K (2) | — | — | 6 |
| Comparative Example 2 | ceria(0.7) | PMAA 11K (2) | PAA 7K (0.35) | — | 6 |
| Comparative Example 3 | ceria(0.7) | PMAA 11K (2) | PAA 250K (0.35) | — | 6 |
| Comparative Example 4 | ceria(0.7) | PMAA 11K (2) | PAA 7K (0.35) | Surfynol ® 465 1300 ppm | 6 |
| Comparative Example 5 | ceria(0.7) | PMAA 11K (2) | PPOMA 5K (0.04) | — | 6 |
| Comparative Example 6 | ceria(0.7) | PMAA 11K (2) | PPOMA 5K (0.4) | — | 6 |

In Table 3, Surfynol® 465 is Ethoxylated-2,4,7,9-tetramethyl-5-decyne-4,7-diol (Air Products and Chemicals, Inc.).

Test Example

Comparison of Polishing Rate of the CMP Slurry Compositions of Examples 1 to 9 and Comparative Examples 1 to 6

Test Example 1

Polishing of Polysilicon Layer 8-inch $SiO_2$ wafer having 6000 Å deposition formed by HDP, and 8-inch poly Si wafer having 8000 Å deposition formed by HDP were polished using the CMP slurry compositions of Table 1 and Table 3 for 1 hour under the polishing conditions as follows.

[Polishing Condition]
Polishing apparatus: Doosan DND UNIPLA210 8-inch
Pad: IC1000/SubalV Stacked (Rodel)
Platen speed: 24 rpm
Carrier speed: 90 rpm
Pressure: 4 psi
Flow rate of slurry: 200 ml/min The thickness of silicon oxide layer and polysilicon layer were measured with Nanospec 6100 apparatus (Nanometrics) before and after polishing, and the polishing rate (polishing speed: Å/min) was calculated from the data. From the calculated polishing rates of each layer, the polishing selectivity of silicon oxide layer to polysilicon of each CMP slurry composition was calculated. The polishing selectivity values are shown in Table 4.

TABLE 4

Polishing rate and polishing selectivity of the CMP slurry compositions of Examples 1 to 9 and Comparative Examples 1 to 6 (SiO2, Poly Si)

| | Polishing speed (Å/min) | | Polishing selectivity |
|---|---|---|---|
| Classification | $SiO_2$ | Poly Si | ($SiO_2$:Poly Si) |
| Example 1 | 3292 | 88 | 37:1 |
| Example 2 | 2957 | 64 | 46:1 |
| Example 3 | 3064 | 74 | 41:1 |
| Example 4 | 3053 | 77 | 40:1 |
| Example 5 | 2302 | 41 | 56:1 |
| Example 6 | 3408 | 79 | 43:1 |
| Example 7 | 2654 | 58 | 46:1 |

TABLE 4-continued

Polishing rate and polishing selectivity of the CMP slurry compositions of Examples 1 to 9 and Comparative Examples 1 to 6 (SiO2, Poly Si)

| | Polishing speed (Å/min) | | Polishing selectivity |
|---|---|---|---|
| Classification | $SiO_2$ | Poly Si | ($SiO_2$:Poly Si) |
| Example 8 | 2488 | 44 | 57:1 |
| Example 9 | 2318 | 35 | 66:1 |
| Comparative Example 1 | 4200 | 1007 | 4:1 |
| Comparative Example 2 | 3765 | 1081 | 3:1 |
| Comparative Example 3 | 4742 | 562 | 8:1 |
| Comparative Example 4 | 3388 | 115 | 29:1 |
| Comparative Example 5 | 4872 | 420 | 12:1 |
| Comparative Example 6 | 4570 | 159 | 29:1 |

According to the results of Table 4, when the CMP slurry composition including a non-ionic polymer additive for obtaining high polishing selectivity and an ionic polymer and was applied to the polishing process, the ratio of the polishing rate of polysilicon layer to the polishing rate of the silicon oxide layer is at least 1:35.

The invention claimed is:

1. A chemical mechanical polishing (CMP) slurry composition comprising:
   an abrasive particle;
   a dispersant;
   an ionic polymer additive; and
   a non-ionic polymer additive comprising a polyolefin-polyethylene glycol copolymer wherein the polyolefin-polyethylene glycol copolymer includes at least two polyethylene glycol repeat units where at least one of the repeat units is a side chain and is represented by Chemical formula 3 or Chemical formula 4:

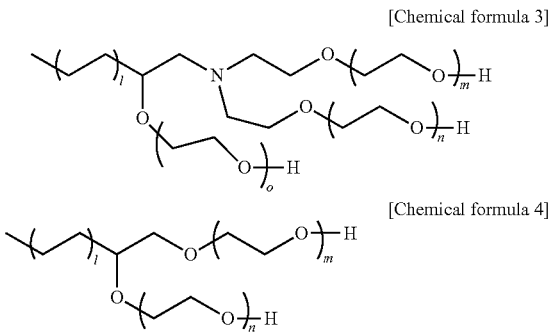

[Chemical formula 3]

[Chemical formula 4]

In Chemical formula 3 and 4, l is an integer of 4 to 100, m is an integer of 4 to 250, n is an integer of 4 to 250, and o is an integer of 4 to 250.

2. The CMP slurry composition according to claim 1, wherein the ionic polymer additive is at least one selected from the group consisting of a comb-type copolymer including a backbone derived from an ionic polymer and a side chains derived from non-ionic polymer; polyacrylic acid; and polymethacrylic acid.

3. The CMP slurry composition according to claim 2, wherein the comb-type copolymer includes an acrylate or a methacrylate repeating unit as a backbone and an alkylene oxide repeating units as a side chain which attach to the backbone to form the comb-type copolymer.

4. The CMP slurry composition according to claim 2, wherein the comb-type copolymer is a comb-type copolymer prepared by polymerizing a monomer represented by Chemical formula 1 and a monomer represented by Chemical formula 2 to form a comb-type shape of the backbone and the side chain:

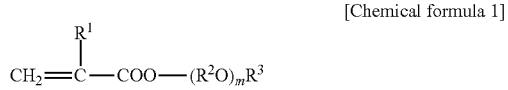

[Chemical formula 1]

in Chemical formula 1,
$R^1$ is a hydrogen or a methyl,
$R^2$ is a C2-3 alkyl,
$R^3$ is a hydrogen or a C1-4 alkyl,
m is an integer of 2 to 100,

[Chemical formula 2]

in Chemical formula 2,
$R^1$ is a hydrogen or a methyl.

5. The CMP slurry composition according to claim 1, wherein the ionic polymer additive is contained in an amount of 0.05 to 5 wt %.

6. The CMP slurry composition according to claim 1, wherein the ionic polymer additive has a weight-average molecular weight of 1,000 to 500,000.

7. The CMP slurry composition according to claim 1, wherein the polyolefin of polyolefin-polyethylene glycol copolymer is a polyethyene or a polyethyene-propylene copolymer having a molecular weight of 100 to 2,000.

8. The CMP slurry composition according to claim 1, wherein the non-ionic polymer additive is contained in an amount of 0.0001 to 5 wt %.

9. The CMP slurry composition according to claim 1, wherein a ratio of the polishing rate of polysilicon layer:the polishing rate of the silicon oxide layer is 1:35 or more.

10. The CMP slurry composition according to claim 1, wherein the abrasive particle comprises a metal oxide particle including at least one selected from the group consisting of silica, alumina, ceria, zirconia and titania;
an organic particle including at least one selected from the group consisting of styrene polymer, acrylic polymer, polyvinylchloride, polyamide, polycarbonate and polyimide; and
an organic-inorganic complex particle including the metal oxide and the organic particle.

11. The CMP slurry composition according to claim 1, wherein the abrasive particle has an average particle diameter of 10 to 500 nm.

12. The CMP slurry composition according to claim 1, wherein the abrasive particle is contained in an amount of 0.001 to 5 wt %.

13. The CMP slurry composition according to claim 1, wherein the dispersant comprises a non-ionic polymer dispersant including at least one selected from the group consisting of polyvinylalcohol(PVA), ethyleneglycol(EG), glycerin, polyethyeneglycol(PEG), polypropyleneglycol(PPG) and polyvinylpyrrolidon(PVP); or
a non-ionic polymer dispersant including at least one selected from the group consisting of polyacrylic acid, ammonium polyacrylate, polymethacrylic acid, ammonium polymethacrylate and polyacrylic maleic acid.

14. The CMP slurry composition according to claim 1, wherein the dispersant is contained in an amount of 0.1 to 100 parts by weight with respect to 100 parts by weight of the abrasive particle.

15. The CMP slurry composition according to claim 1, wherein the composition further comprises a pH adjuster.

16. The CMP slurry composition according to claim 15, wherein the pH adjuster comprises a basic pH adjuster including at least one selected from the group consisting of potassium hydroxide, sodium hydroxide, ammonium water, Rubidium hydroxide, cesium hydroxide, sodium hydrogen carbonate, and sodium carbonate; or
an acidic pH adjuster including at least one selected from the group consisting of hydrochloric acid, nitric acid, sulphuric acid, phosphoric acid, formic acid and acetic acid.

17. The CMP slurry composition according to claim 1, wherein the composition has pH 4 to 8.

18. The CMP slurry composition according to claim 1, wherein the composition comprises:
0.001 to 5 wt % of the abrasive particle;
0.05 to 5 wt % of the ionic polymer additive;
0.0001 to 0.5 wt % of the non-ionic polymer additive;
0.1 to 100 parts by weight of the dispersant with respect to 100 parts by weight of the abrasive particle; and
a residual amount of a pH adjuster and a water.

19. A polishing method comprising a step of polishing the target layer to be polished on a semiconductor substrate with the CMP slurry composition of claim 1.

20. The polishing method according to claim 19, wherein the target layer is a silicon oxide layer.

21. The polishing method according to claim 20, comprising the steps of:
- forming a pattern of a single-crystalline silicon layer or a polysilicon layer on the semiconductor substrate;
- forming a silicon oxide layer on the pattern of single-crystalline silicon layer or polysilicon layer formed on the semiconductor substrate; and
- polishing the silicon oxide layer to expose the single-crystalline silicon layer or the polysilicon layer.

22. The polishing method according to claim 20, wherein the polished silicon oxide layer defines a field region of a semiconductor device, and
- the polishing method is applied to the Shallow Trench Isolation (STI) process of the semiconductor device.

* * * * *